(12) United States Patent
Lin et al.

(10) Patent No.: US 10,163,494 B1
(45) Date of Patent: Dec. 25, 2018

(54) MEMORY DEVICE AND FABRICATION METHOD THEREOF

(71) Applicant: TAIWAN SEMICONDUCTOR MANUFACTURING CO., LTD., Hsinchu (TW)

(72) Inventors: Bing-Chian Lin, Hsinchu County (TW); Ren-Fen Tsui, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/609,167

(22) Filed: May 31, 2017

(51) Int. Cl.
| | |
|---|---|
| G11C 5/06 | (2006.01) |
| G11C 11/419 | (2006.01) |
| G11C 11/418 | (2006.01) |
| H01L 27/11 | (2006.01) |
| H01L 23/528 | (2006.01) |
| H01L 21/768 | (2006.01) |

(52) U.S. Cl.
CPC ............. *G11C 11/419* (2013.01); *G11C 5/06* (2013.01); *G11C 11/418* (2013.01); *H01L 21/76895* (2013.01); *H01L 23/528* (2013.01); *H01L 27/1104* (2013.01); *H01L 27/1116* (2013.01)

(58) Field of Classification Search
CPC ..................................... G11C 5/06; G11C 7/08
USPC .................................................. 365/63, 205
See application file for complete search history.

(56) References Cited

U.S. PATENT DOCUMENTS

| | | | | |
|---|---|---|---|---|
| 4,868,629 A | * | 9/1989 | Eitan | H01L 21/28273 257/316 |
| 5,392,232 A | * | 2/1995 | Kim | H01L 27/10808 257/E27.081 |
| 5,600,588 A | * | 2/1997 | Kawashima | G11C 5/146 365/154 |
| 6,151,244 A | * | 11/2000 | Fujino | G11C 11/401 365/149 |
| 6,166,977 A | * | 12/2000 | Saitoh | G11C 7/06 365/194 |
| 6,551,846 B1 | * | 4/2003 | Furutani | H01L 22/34 257/48 |
| 6,906,954 B2 | * | 6/2005 | Shukuri | B82Y 10/00 365/185.05 |
| 9,299,421 B1 | * | 3/2016 | Lien | G11C 7/1051 |
| 9,525,007 B2 | * | 12/2016 | Pellizzer | H01L 27/2463 |
| 9,627,052 B1 | * | 4/2017 | Pellizzer | G11C 13/0023 |
| 9,685,237 B2 | * | 6/2017 | Park | G11C 16/28 |
| 2001/0046167 A1 | * | 11/2001 | Ayukawa | G11C 5/04 365/200 |
| 2002/0034101 A1 | * | 3/2002 | Semi | G11C 16/24 365/185.23 |

(Continued)

*Primary Examiner* — Michael Tran
(74) *Attorney, Agent, or Firm* — McClure, Qualey & Rodack, LLP (57) ABSTRACT

A device includes a memory bit cell and a retention circuit. The memory bit cell includes a first metal line and a second metal line. The first metal line is disposed in a first metal layer and configured to receive a retention voltage. The second metal line is disposed in the first metal layer and configured to receive a first reference voltage lower than the retention voltage. The retention circuit includes a third metal line. The third metal line is disposed in the first metal layer and configured to transmit the retention voltage to the first metal line. A distance between the second metal line and the third metal line is less than a length of the memory bit cell.

20 Claims, 7 Drawing Sheets

(56) References Cited

U.S. PATENT DOCUMENTS

| | | | |
|---|---|---|---|
| 2004/0070427 A1* | 4/2004 | Miyagi | H03K 19/0016 327/100 |
| 2004/0164360 A1* | 8/2004 | Nishida | G11C 11/4125 257/393 |
| 2004/0183647 A1* | 9/2004 | Arai | G11C 13/0069 338/13 |
| 2005/0051832 A1* | 3/2005 | Fukumura | H01L 27/115 257/314 |
| 2005/0073878 A1* | 4/2005 | Lin | G11C 11/15 365/158 |
| 2006/0098469 A1* | 5/2006 | Yang | G11C 5/063 365/63 |
| 2006/0244041 A1* | 11/2006 | Tanaka | G11C 16/0433 257/315 |
| 2007/0176261 A1* | 8/2007 | Lung | H01L 27/2436 257/536 |
| 2007/0195616 A1* | 8/2007 | Fallah | G11C 29/02 365/194 |
| 2007/0211509 A1* | 9/2007 | Vollrath | G11C 5/063 365/63 |
| 2008/0157259 A1* | 7/2008 | Hayakawa | G11C 5/06 257/500 |
| 2008/0246094 A1* | 10/2008 | Liaw | H01L 27/11 257/392 |
| 2009/0128189 A1* | 5/2009 | Madurawe | H03K 19/17736 326/41 |
| 2009/0189222 A1* | 7/2009 | Shino | H01L 21/84 257/368 |
| 2009/0296477 A1* | 12/2009 | Kim | H01L 27/11521 365/185.17 |
| 2010/0135064 A1* | 6/2010 | Kim | H01L 27/101 365/149 |
| 2010/0230681 A1* | 9/2010 | Taneda | H01L 27/3211 257/59 |
| 2012/0032287 A1* | 2/2012 | Li | H01L 43/08 257/421 |
| 2012/0087171 A1* | 4/2012 | Lee | H01L 45/04 365/148 |
| 2012/0140556 A1* | 6/2012 | Chen | G11C 11/5628 365/185.02 |
| 2012/0218812 A1* | 8/2012 | Takagi | G11C 11/417 365/154 |
| 2012/0314477 A1* | 12/2012 | Siau | G11C 8/08 365/148 |
| 2013/0032775 A1* | 2/2013 | Satoh | H01L 45/04 257/1 |
| 2013/0170275 A1* | 7/2013 | Kumar | G11C 11/412 365/63 |
| 2014/0003181 A1* | 1/2014 | Wang | G11C 11/413 365/226 |
| 2014/0036609 A1* | 2/2014 | Sridhara | G11C 29/50016 365/201 |
| 2014/0056083 A1* | 2/2014 | Yang | G11C 11/5642 365/189.07 |
| 2014/0103414 A1* | 4/2014 | Koldiaev | H01L 21/845 257/296 |
| 2015/0036420 A1* | 2/2015 | Kobatake | G11C 11/412 365/154 |
| 2015/0049557 A1* | 2/2015 | Watanabe | H01L 29/788 365/185.29 |
| 2015/0055402 A1* | 2/2015 | Chen | G11C 7/12 365/156 |
| 2015/0060974 A1* | 3/2015 | Sung | H01L 29/7831 257/314 |
| 2015/0063027 A1* | 3/2015 | Hashimoto | G11C 16/26 365/185.11 |
| 2015/0070962 A1* | 3/2015 | Ohmaru | G11C 11/403 365/72 |
| 2015/0146480 A1* | 5/2015 | Chen | G11C 11/418 365/156 |
| 2015/0255166 A1* | 9/2015 | Tseng | G11C 16/28 365/185.17 |
| 2016/0064043 A1* | 3/2016 | DeCesaris | G11C 5/147 365/226 |
| 2016/0179176 A1* | 6/2016 | Kohara | G06F 1/3237 713/322 |
| 2016/0180930 A1* | 6/2016 | Ogiwara | G11C 13/0069 365/163 |
| 2016/0268341 A1* | 9/2016 | Nazarian | H01L 27/2463 |
| 2016/0336330 A1* | 11/2016 | Masuoka | H01L 27/115 |
| 2017/0271574 A1* | 9/2017 | Inokuchi | H01L 43/02 |

* cited by examiner

MEMORY DEVICE AND FABRICATION METHOD THEREOF

BACKGROUND

A static random-access memory (SRAM) device includes an array of memory cells. The memory calls are arranged in columns and rows and controlled by the operations of word lines and bit lines coupled thereto.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

In this document, the term "coupled" may also be termed as "coupled," and the term "connected" may be termed as "electrically connected". "Coupled" and "connected" may also be used to indicate that two or more elements cooperate or interact with each other.

Moreover, the drawings are for the purpose of illustration only, and are not in accordance with the size of the original drawing.

Figure 1:
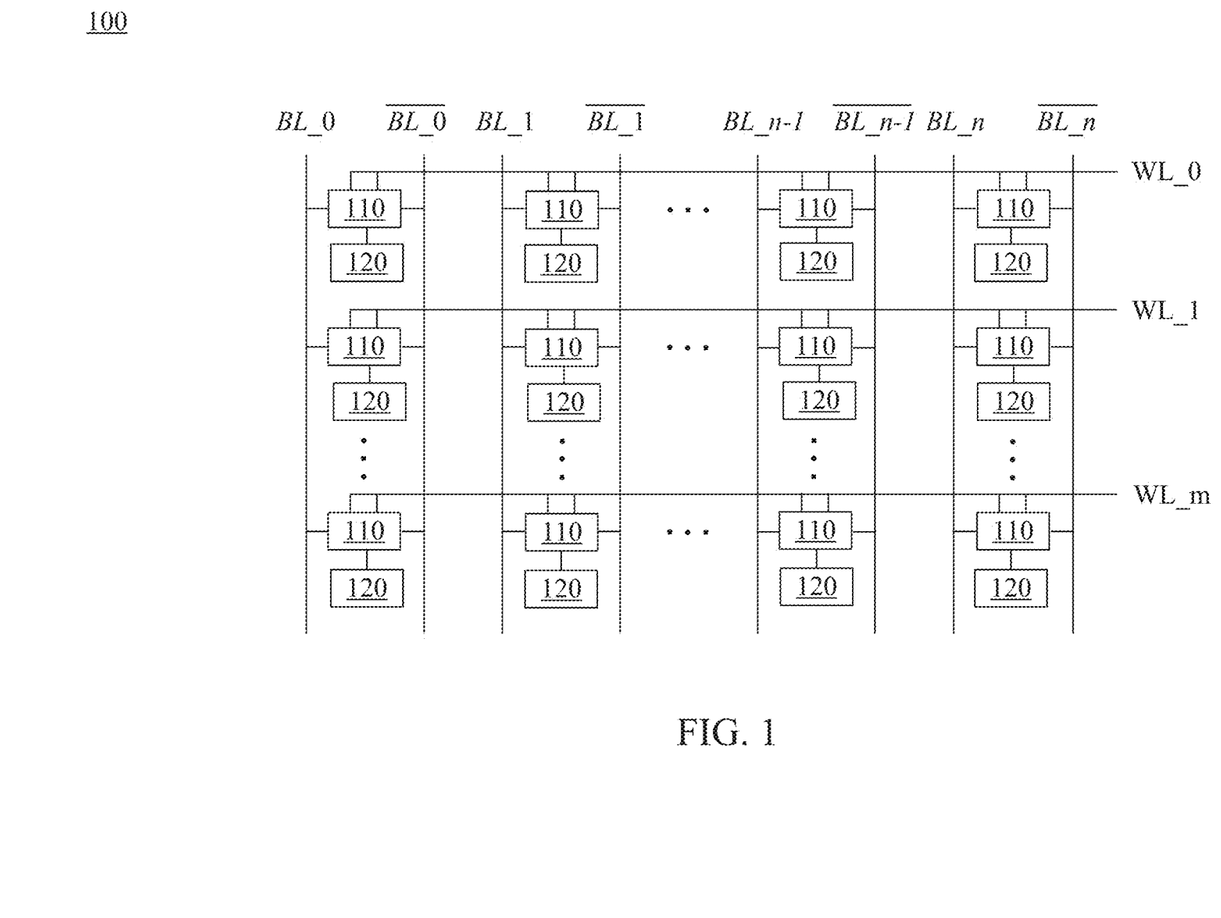
FIG. 1 is a schematic diagram illustrating a memory array, in accordance with some embodiments of the present disclosure.

Reference is now made to FIG. 1. FIG. 1 is a schematic diagram illustrating a memory array 100, in accordance with some embodiments of the present disclosure.

In some embodiments, the memory array 100 is a static random-access memory (SRAM) array. In some embodiments, the memory array 100 includes memory bit cells 110, retention circuits 120, bit lines BL_0, . . . , and BL_n, and $\overline{BL\_0}$, . . . and $\overline{BL\_n}$, and word lines WL_0, . . . , and WL_m. In some embodiments, the memory bit cells 110 are arranged in rows and columns. As illustratively shown in FIG. 1, each of the memory bit cells 110 is disposed at an intersection of one corresponding row and one corresponding column.

In some embodiments, each of the retention circuits 120 is coupled to one corresponding memory bit cell 110. In some embodiments, the memory bit cell 110 is supplied with a higher voltage (for example, a reference voltage VDD in FIG. 2) in a normal mode. For example, the reference voltage VDD is transmitted to the memory bit cell 110 through an electrical connection (not shown). In some embodiments, the memory bit cell 110 is supplied with a lower voltage (for example, a retention voltage CVDD in FIG. 2) in a retention mode by the retention circuit 120, in order to keep data stored in the memory bit cell 110 and to reduce power consumption.

In some embodiments, each pair of the bit lines BL_0, . . . , and BL_n, and $\overline{BL\_0}$, . . . and $\overline{BL\_n}$ are coupled to one of columns of the memory bit cells 110. For example, the bit lines BL_0 and $\overline{BL\_0}$ are coupled to the first column of the memory bit cells 110, the bit lines BL_1 and $\overline{BL\_1}$ are coupled to the second column of the memory bit cells 110, and so on. In some embodiments, each of the word lines WL_0, . . . , and WL_m is coupled to one of rows of the memory bit cells 110. For example, the word line WL_0 is coupled to the first row of the memory bit cells 110, the word line WL_1 is coupled to the second row of the memory bit cells 110, and so on.

In some embodiments, based on operations of an address decoder (not shown), one of the word lines WL_0, . . . , and WL_m is used to select one of the rows of the memory bit cells 110. In some embodiments, one pair of the bit lines, which correspond to one of the columns of the memory bit cells 110, are used to perform read operation and/or write operation on one of the memory bit cells 110 disposed at the intersection of the corresponding row and the corresponding column.

The numbers of the memory bit cells 110, the retention circuits 120, the bit lines BL_0, . . . , and BL_n, and BL_0, . . . and $\overline{BL\_n}$, and the word lines WL_0, . . . , and WL_m in FIG. 1 are given for illustrative purposes only. Various numbers of the memory bit cells 110, the retention circuits 120, the bit lines BL_0, . . . , and BL_n, and BL_0, . . . and $\overline{BL\_n}$, and the word lines WL_0, . . . , and WL_m are within the contemplated scope of the present disclosure.

Figure 2:
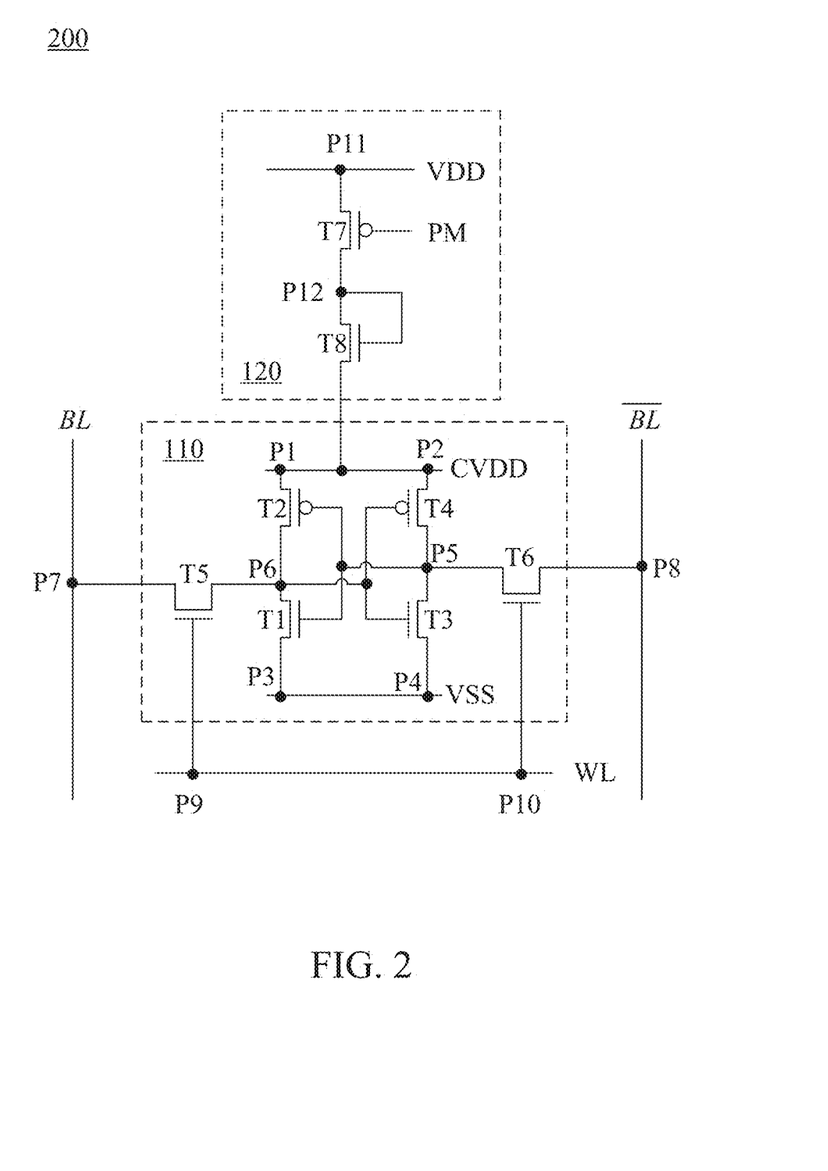
FIG. 2 is a circuit diagram illustrating a memory device in the memory array in FIG. 1, in accordance with some embodiments of the present disclosure.

Reference is now made to FIG. 2. FIG. 2 is a circuit diagram illustrating a memory device 200 in the memory array 100 in FIG. 1, in accordance with some embodiments of the present disclosure. For ease of understanding, with respect to the embodiments of FIG. 1, like elements in FIG. 2 are designated with the same reference numbers.

In some embodiments, the memory device 200 includes a memory bit cell 110 and a corresponding retention circuit 120 in FIG. 1, a corresponding pair of bit lines BL and $\overline{BL}$, and a corresponding word line WL. In some embodiments, the bit lines BL and $\overline{BL}$ in FIG. 2 correspond to one pair of the bit lines BL_0, . . . , and BL_n, and $\overline{BL\_0}$, . . . and $\overline{BL\_n}$ in FIG. 1, and the word line WL in FIG. 2 corresponds to one of the word lines WL_0, . . . , and WL_m in FIG. 1. For ease of understanding, one memory bit cell 110, two bit lines BL and $\overline{BL}$, and one word line WL are illustrated in the memory device 200 in FIG. 2, but the present disclosure is not limited thereto.

In some embodiments, the memory bit cell 110 is a six-transistor (6T) cell that includes transistors T1-T6. The memory bit cell 110 operates based on the reference voltage VDD and a reference voltage VSS. In some embodiments, the reference voltage VDD indicates a power voltage. In some embodiments, the reference voltage VSS indicates a ground voltage. In some embodiments, the reference voltage VDD is higher than the reference voltage VSS. In some embodiments, the transistors T1, T3, T5, and T6 are implemented with N-type transistors, and the transistors T2 and T4 are implemented with P-type transistors. In some embodiments, the transistors T1 and T2 are coupled between a node P1 and a node P3, and the transistors T3 and T4 are coupled between a node P2 and a node P4. In some embodiments, the transistors T1-T4 are coupled to operate as two cross-coupled inverters.

In some embodiments, first source/drains of the transistors T2 and T4 are coupled to the retention circuit 120 through the nodes P1 and P2 respectively. In some embodiments, first source/drains of the transistors T1 and T3 are coupled to the reference voltage VSS through the nodes P3 and P4 respectively. In some embodiments, gates of the transistors T1 and T2 are coupled to second source/drains of the transistors T3 and T4 through a node P5 and further to a first source/drain of the transistor T6. In some embodiments, gates of the transistors T3 and T4 are coupled to second source/drains of the transistors T1 and T2 through a node P6 and further to a first source/drain of the transistor T5. In some embodiments, a second source/drain of the transistor T5 is coupled to the bit line BL through a node P7. In some embodiments, a second source/drain of the transistor T6 is coupled to the bit line $\overline{BL}$ through a node P8. In some embodiments, gates of the transistor T5 and T6 are coupled to the word line WL through a node P9 and a node P10 respectively.

In some embodiments, the word line WL is configured to control the transistors T5 and T6. With the turned-on transistors T5 and T6, the memory bit cell 110 is coupled to the bit lines BL and $\overline{BL}$ through the transistors T5 and T6 respectively. In some embodiments, the bit lines BL and $\overline{BL}$ are used to transfer data from the transistors T1-T4 for the read operation, and/or to transfer data to the transistors T1-T4 for the write operation.

The configurations of the memory bit cell 110 are given for illustrative purposes only. Various configurations of the memory bit cell 110 are within the contemplated scope of the present disclosure.

In some embodiments, the retention circuit 120 includes transistors T7 and T8. In some embodiments, the transistor T7 is implemented with a P-type transistor and the transistor T8 is implemented with an N-type transistor. In some embodiments, a first source/drain of the transistor T7 is coupled to the reference voltage VDD through a node P11. In some embodiments, a gate of the transistor T7 is configured to receive a control signal PM. Accordingly, the transistor T7 is controlled, by the control signal PM, to be turned on or turned off. In some embodiments, a second source/drain of the transistor T7 is coupled to a first source/drain of the transistor T8 through a node P12. In some embodiments, a gate of the transistor T8 is coupled to the first source/drain of the transistor T8 through the node P12, in order to operate as a diode-connected transistor. In some embodiments, a second source/drain of the transistor T8 is coupled to the first source/drains of the transistors T2 and T4 through the nodes P1 and P2 respectively.

In some embodiments, on condition that the memory bit cell 110 operates in the retention mode, the control signal PM has a logic value "0." Accordingly, the transistor T7 is turned on, and the reference voltage VDD is transmitted to the node P12. The retention voltage CVDD at the node P1 or P2 is approximately equal to the reference voltage VDD minus a threshold voltage of the transistor T8. Effectively, the reference voltage VDD is generated based on the control signal PM and the reference voltage VDD. In some embodiments, the retention voltage CVDD is lower than the reference voltage VDD, and the retention voltage CVDD is higher than the reference voltage VSS. In some embodiments, the retention voltage CVDD is configured to be supplied to the memory cell 110 in the retention mode, in order to keep the data stored in the memory bit cell 110. In some embodiments, since the retention voltage CVDD is lower than the reference voltage VDD, providing the retention voltage CVDD instead of the reference voltage VDD into the memory bit cell 110 to keep data can reduce power consumption.

The configurations of the retention circuit 120 are given for illustrative purposes only. Various configurations of the retention circuit 120 are within the contemplated scope of the present disclosure.

Figure 3A:
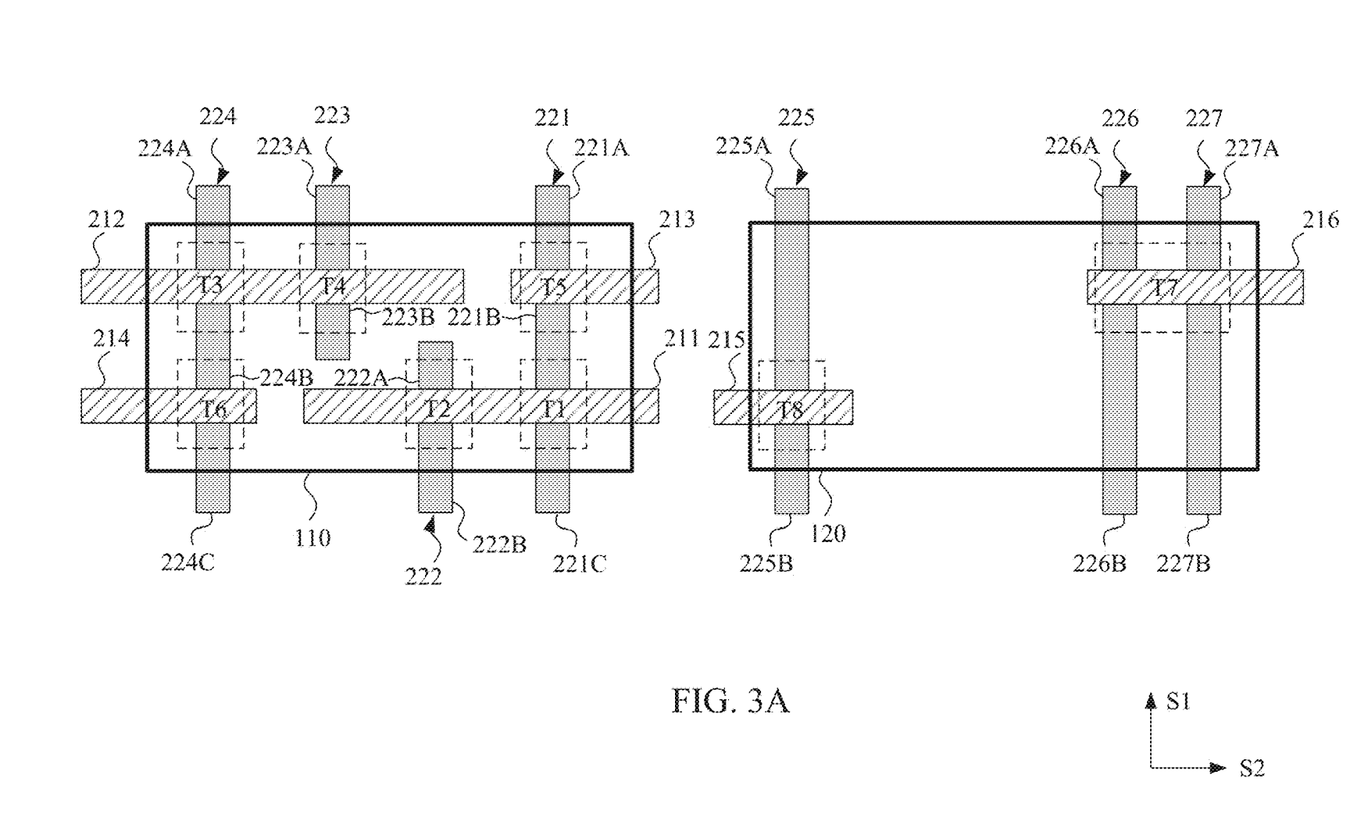
FIG. 3A is a layout diagram of the memory device in FIG. 2 without any interconnection, in accordance with some embodiments of the present disclosure.

Reference is now made to FIG. 3A. FIG. 3A is a layout diagram of the memory device 200 in FIG. 2 without any interconnection, in accordance with some embodiments of the present disclosure. For ease of understanding, with respect to the embodiments of FIG. 2, like elements in FIG. 3A are designated with the same reference numbers.

In some embodiments, components illustrated in FIG. 3A are disposed on a semiconductor substrate. The semiconductor substrate includes, for example, a silicon substrate or other suitable semiconductor substrate.

As illustratively shown in FIG. 3A, each of the transistors T1-T8 of the memory device 200 in FIG. 2 is illustrated within a dashed line frame. In some embodiments, memory bit cell 110 includes gate electrodes 211-214 arranged to form the gates of the transistors T1-T6. In some embodiments, the retention circuit 120 includes gate electrodes 215-216 arranged to form the gates of the transistors T7-T8. In some embodiments, the gate electrodes 211-216 are formed of a conductive material. The conductive material includes, for example, metals, metal alloys, or metal silicides. Various conductive materials of the gate electrodes 211-216 are within the contemplated scope of the present disclosure.

In some embodiments, the memory bit cell 110 further includes fin structures 221-224, and the retention circuit 120 further includes fin structures 225-227. The fin structures 221-227 are arranged as active regions of the semiconductor substrate, and are arranged to form sources/drains of the transistors T1-T8 after epitaxy. The term "source/drain" is referred to as a region that is either a source region or a drain region, in the present disclosure.

The numbers of the fin structures in each of the transistors T1-T8 in FIG. 3A are given for illustrative purposes. Various numbers of the fin structures in each of the transistors T1-T8 are within the contemplated scope of the present disclosure. For example, in some embodiments, the transistor T7 includes four fin structures and the transistor T8 includes two fin structures.

In some embodiments, the fin structure 221 includes fin sections 221A-221C. The fin section 221A corresponds to the second source/drain of the transistor T5, and the fin section 221B corresponds to the first source/drain of the transistor T5. Alternatively stated, the fin section 221A, the gate electrode 213, and the fin section 221B together correspond to the transistor T5.

In some embodiments, the fin section 221B also corresponds to the second source/drain of the transistor T1, and the fin section 221C corresponds to the first source/drain of the transistor T1. Alternatively stated, the fin section 221B, the gate electrode 211, and the fin section 221C together correspond to the transistor T1.

In some embodiments, the fin structure 222 includes fin sections 222A-222B. The fin section 222A corresponds to the second source/drain of the transistor T2, and the fin section 222B corresponds to the first source/drain of the transistor T2. Alternatively stated, the fin section 222A, the gate electrode 211, and the fin section 222B together correspond to the transistor T2.

In some embodiments, the fin structure 223 includes fin sections 223A-223B. The fin section 223A corresponds to the first source/drain of the transistor T4, and the fin section 223B corresponds to the second source/drain of the transistor T4. Alternatively stated, the fin section 223A, the gate electrode 212, and the fin section 223B together correspond to the transistor T4.

In some embodiments, the fin structure 224 includes fin sections 224A-224C. The fin section 224A corresponds to the first source/drain of the transistor T3, and the fin section 224B corresponds to the second source/drain of the transistor T3. Alternatively stated, the fin section 224A, the gate electrode 212, and the fin section 224B together correspond to the transistor T3.

In some embodiments, the fin section 224B also corresponds to the first source/drain of the transistor T6, and the fin section 224C corresponds to the second source/drain of the transistor T6. Alternatively stated, the fin section 224B, the gate electrode 214, and the fin section 224C together correspond to the transistor T6.

In some embodiments, the fin structure 225 includes fin sections 225A-225B. The fin section 225A corresponds to the first source/drain of the transistor T8, and the fin section 225B corresponds to the second source/drain of the transistor T8. Alternatively stated, the fin section 225A, the gate electrode 215, and the fin section 225B together correspond to the transistor T8.

In some embodiments, the fin structure 226 includes fin sections 226A-226B, and the fin structure 227 includes fin sections 227A-227B. The fin sections 226A and 227A correspond to the first source/drain of the transistor T7, and the fin sections 226B and 227B correspond to the second source/drain of the transistor T7. Alternatively stated, the fin sections 226A and 227A, the gate electrode 216, and the fin sections 226B and 227B together correspond to the transistor T7.

Figure 3B:
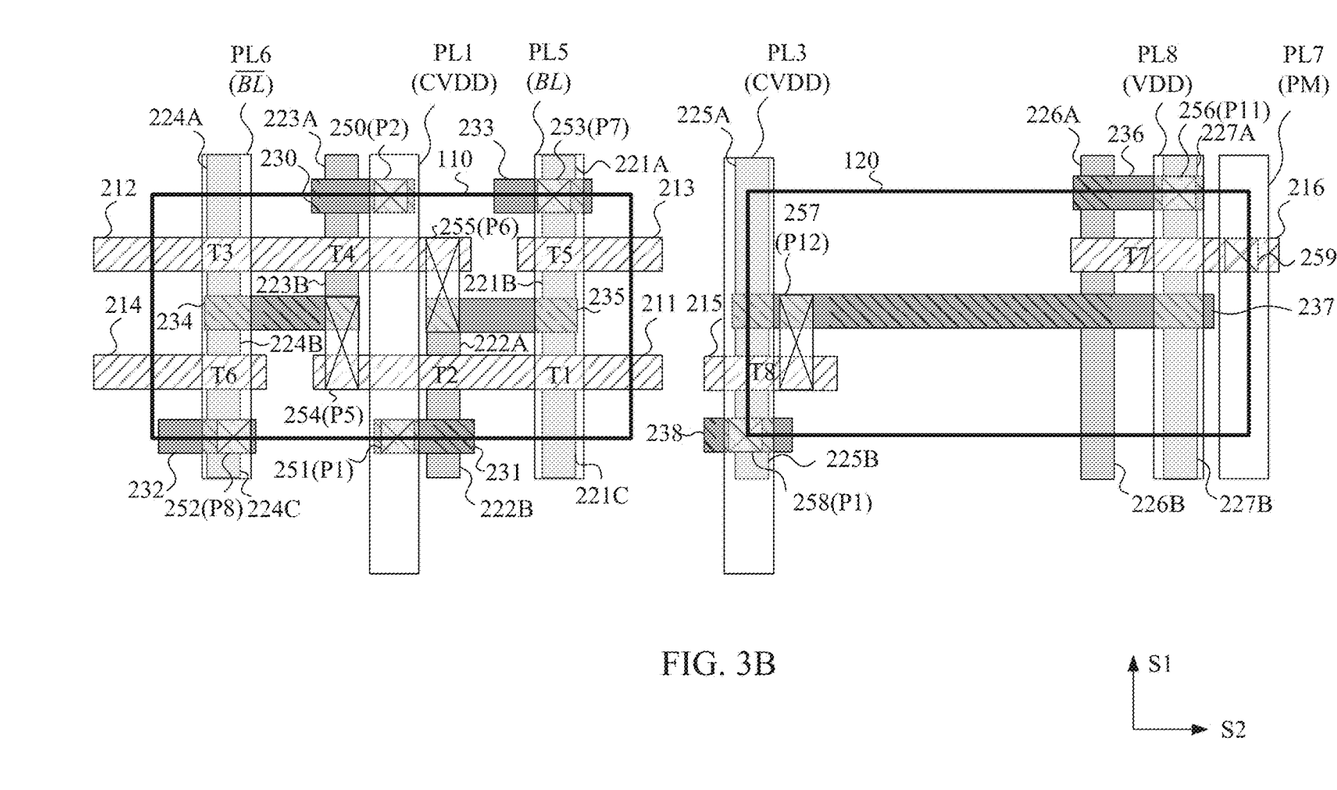
FIG. 3B is a layout diagram of the memory device in FIG. 3A with interconnections coupled to a reference voltage and bit lines, in accordance with some embodiments of the present disclosure.

Reference is now made to FIG. 3B. FIG. 3B is a layout diagram of the memory device in FIG. 3A with interconnections coupled to the reference voltage VDD and bit lines BL and $\overline{BL}$, in accordance with some embodiments of the present disclosure. For ease of understanding, with respect to the embodiments of FIG. 2, like elements in FIG. 3B are designated with the same reference numbers. As illustratively shown in FIG. 3B, for simplicity, the transistors T1-T8 are only labeled as T1-T8 without the dashed line frame.

In some embodiments, the interconnections includes interconnection lines 230-238 and contacts 250-259. In some embodiments, the interconnection lines 230-238 and the contacts 250-259 are formed of conductive materials. The conductive materials are, for example, metals. Various conductive materials of the interconnection lines 230-238 and the contacts 250-259 are within the contemplated scope of the present disclosure.

In some embodiments, the interconnection line 230 couples the fin section 223A, which corresponds to the first source/drain of the transistor T4. The contact 250 (indicating the node P2) further couples the interconnection line 230 to a metal line PL1.

In some embodiments, the interconnection line 231 couples the fin section 222B, which corresponds to the first source/drain of the transistor T2. The contact 251 (indicating the node P1) couples the interconnection line 231 to the metal line PL1. In some embodiments, the retention voltage CVDD from the retention circuit 120 is received by the metal line PL1 in the retention mode. The retention voltage CVDD is supplied to the transistors T2 and T4 through the contacts 250-251 and interconnection lines 230-231 on condition that the memory device 200 operates in the retention mode.

In some embodiments, the interconnection line 232 couples the fin section 224C, which corresponds to the second source/drain of the transistor T6. The contact 252 (indicating the node P8) further couples the interconnection line 232 to a metal line PL6 arranged to operate as the bit line $\overline{BL}$.

In some embodiments, the interconnection line 233 couples the fin section 221A, which corresponds to the second source/drain of the transistor T5. The contact 253 (indicating the node P7) couples the interconnection line 233 to a metal line PL5 arranged to operate as the bit line BL.

In some embodiments, the interconnection line 234 couples the fin sections 223B and 224B. The fin section 223B corresponds to the second source/drain of the transistor T4. The fin section 224B corresponds to the second source/drain of the transistor T3 and the first source/drain of the transistor T6. The contact 254 (indicating the node P5) couples the interconnection line 234 to the gate electrode 211 corresponding to the gates of the transistors T1 and T2.

In some embodiments, the interconnection line 235 couples the fin sections 221B and 222A. The fin section 221B corresponds to the first source/drain of the transistor T5 and the second source/drain of the transistor T1. The fin section 222A corresponds to the second source/drain of the transistor T2. The contact 255 (indicating the node P6) couples the interconnection line 235 to the gate electrode 212 corresponding to the gates of the transistors T4 and T3.

In some embodiments, the interconnection line 236 couples the fin sections 226A and 227A. The fin sections 226A and 227A correspond to the first source/drain of the transistor T7. The contact 256 (indicating the node P11) couples the interconnection line 236 to a metal line PL8. In some embodiments, the metal line PL8 is configured to receive the reference voltage VDD and provide the reference voltage VDD to the transistor T7.

In some embodiments, the interconnection line 237 couples the fin sections 225A, 226B, and 227B. The fin sections 226B and 227B correspond to the second source/drain of the transistor T7. The fin section 225A corresponds to the first source/drain of the transistor T8. The contact 257 (indicating the node P12) couples the interconnection line 237 to the gate electrode 215 corresponding to the gate of the transistors T8, in order to form the diode-connection transistor illustrated in FIG. 2.

In some embodiments, the interconnection line 238 couples the fin section 225B. The fin section 225B corresponds to the second source/drain of the transistor T8. The contact 258 (indicating the node P1) couples the interconnection line 238 to a metal line PL3. The retention voltage CVDD is generated at the metal line PL3 by the transistor T8 according to the reference voltage VDD on condition that the memory device 200 operates in the retention mode.

In some embodiments, the contact 259 couples a metal line PL7. In some embodiments, a metal segment (not shown) are coupled to the metal line PL7 and configured to receive the control signal PM illustrated in FIG. 2.

Figure 3C:
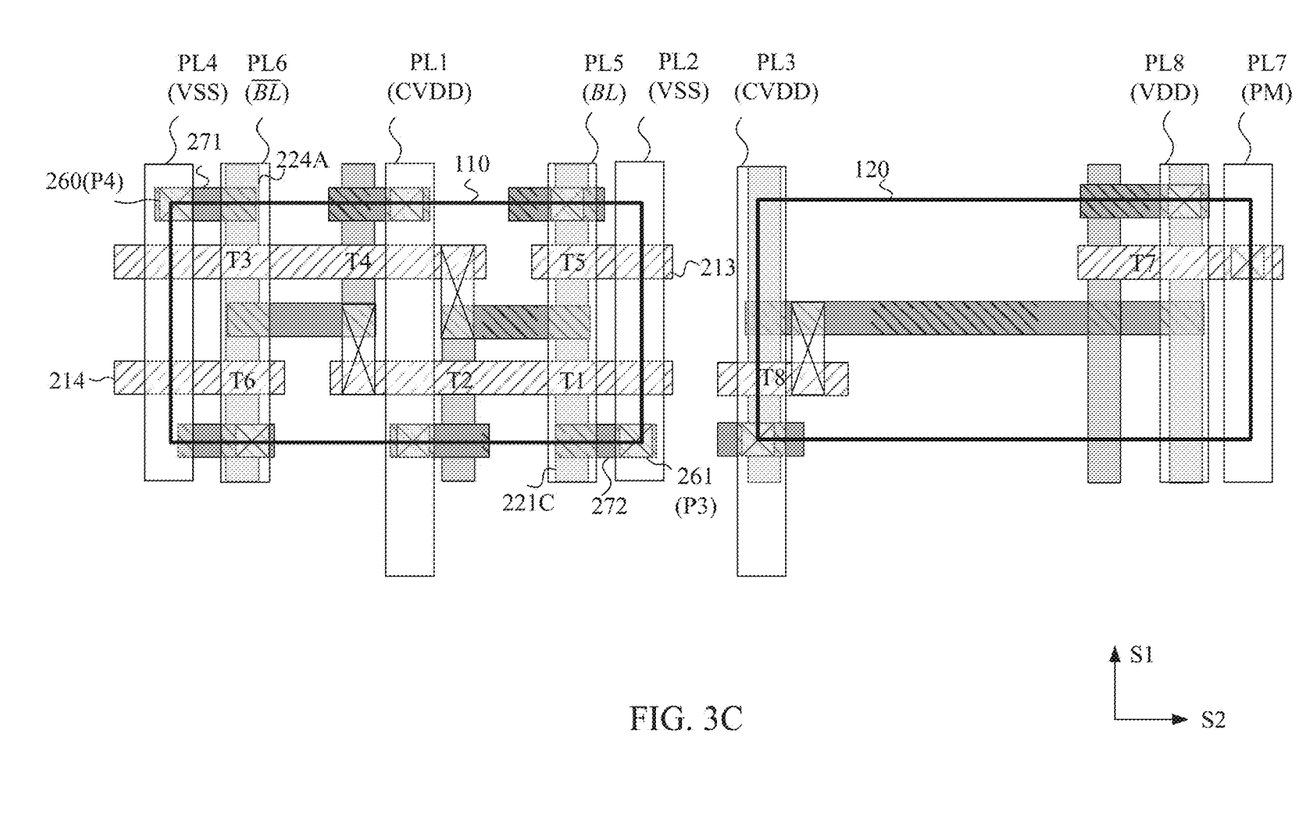
FIG. 3C is a layout diagram of the memory device in FIG. 3B with additional interconnections coupled to a reference voltage, in accordance with various embodiments of the present disclosure.

FIG. 3C is a layout diagram of the memory device in FIG. 3B with additional interconnections coupled to the reference voltage VSS, in accordance with various embodiments of the present disclosure. For ease of understanding, with respect to the embodiments of FIG. 2, like elements in FIG. 3C are designated with the same reference numbers.

For ease of understanding, the numeral labels unrelated to the additional interconnections are not illustrated in FIG. 3C. As illustratively shown in FIG. 3C, the additional interconnections include interconnection lines 271-272 and contacts 260-261. In some embodiments, the interconnection lines 271-272 and the contacts 260-261 are formed of conductive materials. The conductive materials are, for example, metals. Various conductive materials of the additional interconnections are within the contemplated scope of the present disclosure.

In some embodiments, the interconnection line 271 couples the fin section 224A. The fin section 224A corresponds to the first source/drain of the transistor T3. The contact 260 (indicating the node P4) couples the interconnection line 271 to a metal line PL4, and the metal line PL4 is configured to receive the reference voltage VSS.

In some embodiments, the interconnection line 272 couples the fin section 221C. The fin section 221C corresponds to the first source/drain of the transistor T1. The contact 261 (indicating the node P3) couples the interconnection line 272 to a metal line PL2, and the metal line PL2 is configured to receive the reference voltage VSS.

Figure 3D:
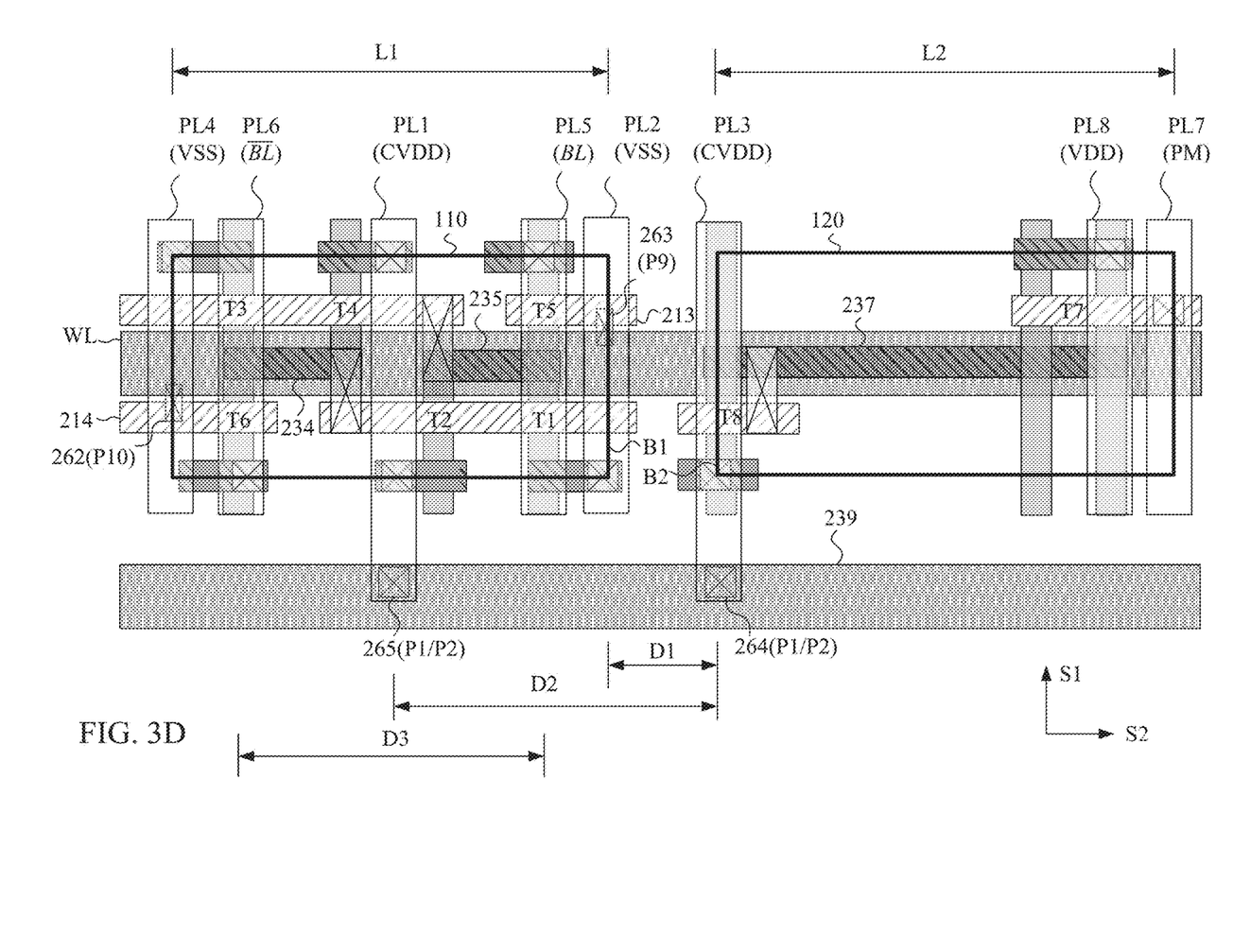
FIG. 3D is a layout diagram of the memory device in FIG. 3C with additional interconnections coupled to a word line, in accordance with various embodiments of the present disclosure.

Reference is now made to FIG. 3D. FIG. 3D is a layout diagram of the memory device in FIG. 3C with additional interconnections coupled to a word line WL, in accordance with various embodiments of the present disclosure. For ease of understanding, with respect to the embodiments of FIG. 2, like elements in FIG. 3D are designated with the same reference numbers.

For ease of understanding, the numeral labels unrelated to the additional interconnections are not illustrated in FIG. 3D. As illustratively shown in FIG. 3D, the additional interconnections include interconnection lines 239 and contacts 262-265. In some embodiments, the interconnection lines 239 and the contacts 262-265 are formed of conductive materials. The conductive materials are, for example, metals. Various conductive materials of the additional interconnections are within the contemplated scope of the present disclosure.

In some embodiments, the metal lines PL1-PL8 are formed within a metal one (M1) layer. In some embodiments, the word line WL and the interconnection line 239 are formed within a metal two (M2) layer different from the metal one (M1) layer. In some embodiments, in a top-down sequence, the metal two (M2) layer is formed on the metal one (M1) layer.

In some embodiments, the contact 262 (indicating the node P10) couples the gate electrode 214 corresponding to the gate of the transistor T6 to the word line WL. The contact 263 (indicating the node P9) couples the gate electrode 213 corresponding to the gate of the transistor T5 to the word line WL. In some embodiments, a metal segment (not shown) is coupled to the word line WL and configured to receive driving signals (not shown), in order to drive the word line WL.

In some embodiments, the contact 264 (indicating the node P1 or P2) couples the interconnection line 239 to the metal line PL3, and the contact 265 (indicating the node P1 or P2) couples the interconnection line 239 to the metal line PL1. Effectively, the metal lines PL1 and PL3 are coupled to each other through the contacts 264-265 and the interconnection line 239. As described above, the retention voltage CVDD is generated at the metal line PL3 on condition that the memory device 200 operates in the retention mode. Since the metal lines PL1 and PL3 are coupled to each other, the retention voltage CVDD is thus transmitted from the metal line PL3 to the metal line PL1 on condition that the memory device 200 operates in the retention mode. Thus, the retention voltage CVDD is generated at the metal lines PL1 and PL3 on condition that the memory device 200 operates in the retention mode.

In some embodiments, the layout diagram in FIG. 3D is formed through one or more processors. In some embodiments, the memory device 200 is formed through one or more semiconductor manufacturing equipment according to the layout diagram in FIG. 3D, but this disclosure is not limited thereto.

Figure 4:
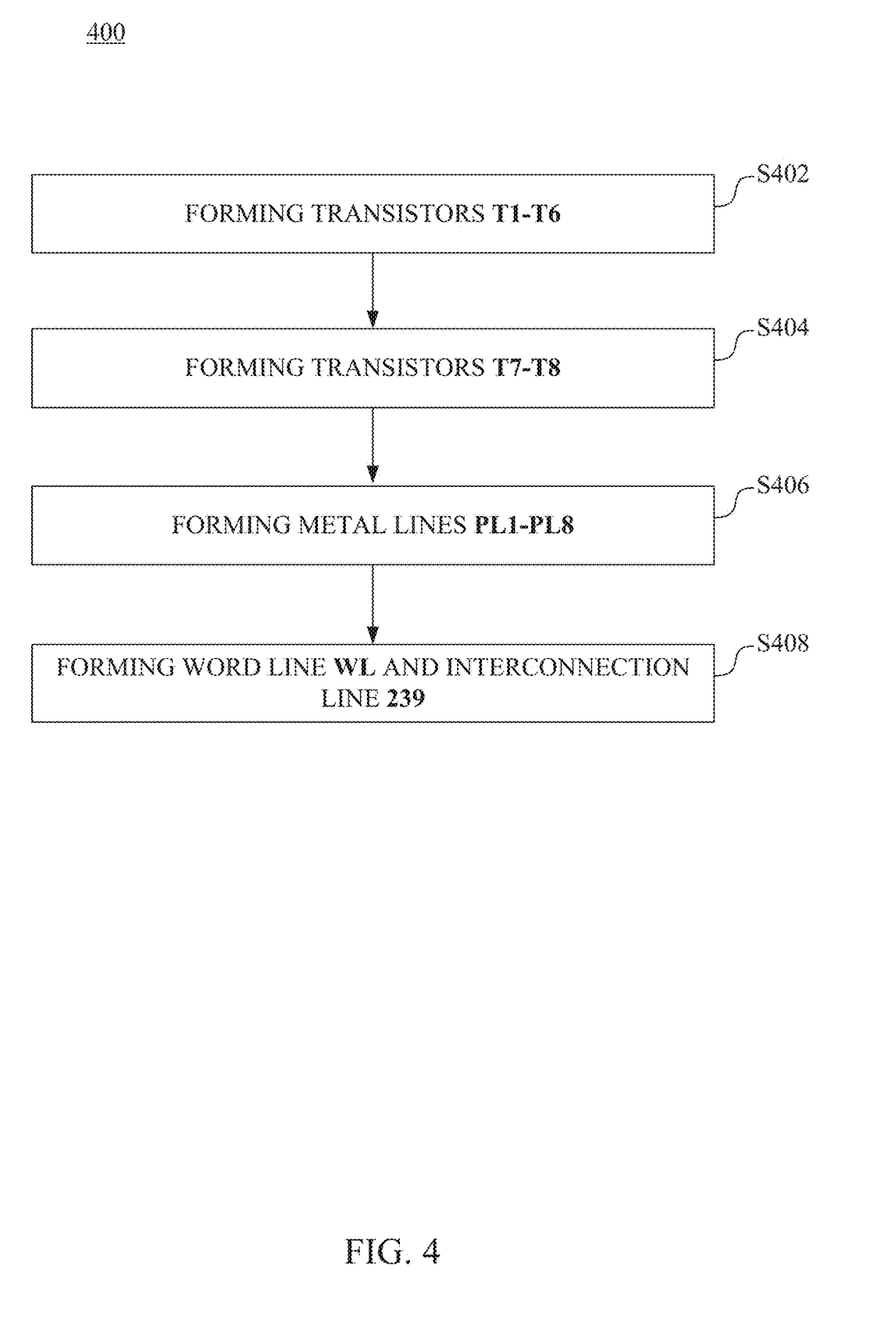
FIG. 4 is a flow chart of a method illustrating the fabrication process of the memory device in FIG. 2, in accordance with some embodiments of the present disclosure.

Reference is now made to FIG. 4. FIG. 4 is a flow chart of a method 400 illustrating the fabrication process of the memory device 200 in FIG. 2, in accordance with some embodiments of the present disclosure. For ease of understanding, the method 400 is discussed in relation to the memory device 200 in FIG. 2 and FIGS. 3A-3D, but the present disclosure is not limited thereto.

In operation S402, the transistors T1-T6 are formed. In some embodiments, the memory bit cell 110 includes the transistors T1-T6.

In operation S404, the transistors T7-T8 are formed. In some embodiments, the retention circuit 120 includes the transistors T7-T8. In some embodiments, the retention circuit 120 is disposed at a side of the memory bit cell 110.

With reference to FIG. 3A and FIG. 3B, the fin structures 221-227, the gate electrode 211-216, the interconnection line 230-238 and the contacts 254, 255, and 257 are formed, in order to form the transistors T1-T8. In some embodiments, the fin structures 221-227 extend along a direction S1, and the gate electrode 211-216 extend along a direction S2. In some embodiments, the direction S2 is different from the direction S1. In some embodiments, the direction S2 is perpendicular to the direction S1.

In some embodiments, the retention circuit 120 and the memory bit cell 110 are formed by the same layout design rule. For example, the gate electrodes 212 and 213 of the memory bit cell 110 are aligned with the gate electrode 216 of the retention circuit 120 in the direction S2. Correspondingly, the gate electrodes 211 and 214 of the memory bit cell 110 are aligned with the gate electrode 215 of the retention circuit 120 in the direction S2. As a result, the retention circuit 120 and the memory bit cell 110 can be tracked well. In addition, the contacts 250-253 and 256, 258-259 are formed to couple the memory bit cell 110 or the retention circuit 120 to the metal line PL1-PL8.

In operation S406, the metal lines PL1-PL8 are formed. With reference to FIG. 3B and FIG. 3C, in some embodiments, the metal lines PL1-PL8 extends along the direction S1, and the metal lines PL1-PL8 are coupled to at least one of the contacts 250-253, 256, and 258-259. In some embodiments, the metal line PL7 is formed to receive the control signal PM, and the metal line PL8 is formed to receive the reference voltage VDD. In some embodiments, the metal line PL3 is formed to transmit the retention voltage CVDD to the metal line PL1 through the interconnection line 239 (illustrated in FIG. 3D). In some embodiments, the metal lines PL5 and PL6 are formed to operate as the pair of bit lines BL and $\overline{BL}$. In some embodiments, the metal lines PL2 and PL4 are formed to receive the reference voltage VSS.

With reference to FIG. 3D, in some embodiments, a length L2 of the retention circuit 120 is greater than a length L1 of the memory bit cell 110. For example, the length L2 of the retention circuit 120 is approximately 1.2-1.6 times greater than the length L1. In some embodiments, the length L1 of the memory bit cell 110 corresponds to a longer side of the memory bit cell 110, and a width of the memory bit cell 110 corresponds to a shorter side of the memory bit cell 110. Correspondingly, the length L2 of the retention circuit 120 corresponds to a longer side of the retention circuit 120, and a width of the retention circuit 120 corresponds to a shorter side of the retention circuit 120. In some embodiments, with reference to FIG. 3D, the length L1 of the memory bit cell 110 is approximately equal to a distance between the metal line PL4 and the metal line PL2. For example, the length L1 is equal to a distance between a central axis of the metal line PL4 and a central axis of the metal line PL2. In some embodiments, the length L2 of the retention circuit 120 is approximately equal to a distance between the metal line PL3 and the metal line PL7. For example, the length L2 is equal to a distance between a central axis of the metal line PL3 and a central axis of the metal line PL7.

As described above, in some embodiments, the retention circuit 120 and the memory bit cell 110 are formed by the same layout design rule. Effectively, the formations of the memory bit cell 110 and the retention circuit 120 follow the same design rule manual (DRM), for example, a SRAM DRM. Thus, the memory bit cell 110 and the retention circuit 120 can be tracked well. For example, the retention circuit 120 and the memory bit cell 110 are disposed within a SRAM area. Thus, there is no a huge design margin between the retention circuit 120 and the memory bit cell 110, and the retention circuit 120 is adjacent to the memory bit cell 110. On condition that the retention circuit 120 is adjacent to the memory bit cell 110, the chip size of the memory array 100 can be reduced. In addition, on condition that the retention circuit 120 is adjacent to the memory bit cell 110, an electrical connection between the retention circuit 120 and the memory bit cell 110 can be shortened. Thus, the power consumption of the memory array 100 can be reduced.

In some embodiments, the metal line PL2 is disposed as a side B1 of the memory bit cell 110, and the metal line PL3 is disposed as a side B2 of the retention circuit 120. In some embodiments, the metal line PL3 is disposed at a side of the metal line PL2, and the metal line PL3 is adjacent to the metal line PL2. In some embodiments, a distance D1 between the metal line PL3 and the metal line PL2 is less than the length L1 of the memory bit cell 110. In some embodiments, the distance D1 is a distance between a central axis of the metal line PL3 and a central axis of the metal line PL2. Effectively, the retention circuit 120 is disposed with the distance D1 from the memory bit cell 110, and the distance D1 is less than the length L1 of the memory bit cell 110. As described above, in some embodiments, the length L2 of the retention circuit 120 is greater than the length L1 of the memory bit cell 110, the distance D1 is less than the length L2 of the retention circuit 120. In some embodiments, the distance D1 is also less than a distance D3. In some embodiments, the distance D3 is a distance between a central axis of the metal line PL5 and a central axis of the metal line PL6.

In some embodiments, a distance D2 between the metal line PL1 and the metal line PL3 is approximately equal to the length L1 of the memory bit cell 110. In some embodiments, the distance D2 is a distance between a central axis of the metal line PL1 and a central axis of the metal line PL3. In some embodiments, the distance D2 is less than the length L1 of the memory bit cell 110. In some embodiments, the metal line PL1 and the metal line PL3 are formed at two sides of the metal line PL2 respectively. Thus, the distance D2 is greater than the distance D1.

In operation S408, the word line WL and the interconnection line 239 are formed. With respect to FIG. 3D, in some embodiments, the word line WL and the interconnection line 239 extend along the direction S2. In some embodiments, the word line WL covers the interconnection lines 234, 235, and 237. In some embodiments, the interconnection line 239 is coupled to the metal line PL1 and the metal line PL3 through the contacts 264-265.

The above description of the method 400 includes exemplary operations, but the operations of the method 400 are not necessarily performed in the order described. The order of the operations of the method 400 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

In some embodiments, the memory bit cell 110 and the retention circuit 120 can be designed with the same design rule and can be tracked well. Thus, the chip size of the memory array 100 can be reduced and the power consumption of the memory array 100 can be reduced.

In some embodiments, a device is disclosed that includes a memory bit cell and a retention circuit. The memory bit cell includes a first metal line and a second metal line. The first metal line is disposed in a first metal layer and configured to receive a retention voltage. The second metal line is disposed in the first metal layer and configured to receive a first reference voltage lower than the retention voltage. The retention circuit includes a third metal line. The third metal line is disposed in the first metal layer and configured to transmit the retention voltage to the first metal line. A distance between the second metal line and the third metal line is less than a length of the memory bit cell.

Also disclosed is a device that includes a memory bit cell and a retention circuit. The memory bit cell includes a first metal line and a second metal line. The first metal line extends along a first direction and is configured to receive a retention voltage. The second metal line extends along the first direction and configured to receive a first reference voltage lower than the retention voltage. The retention circuit includes a third metal line. The third metal line disposed at a side of the second metal line and configured to transmit the retention voltage to the first metal line. A distance, along a second direction, between a side of the memory bit cell and a side of the retention circuit is less than a length of the retention circuit.

Also disclosed is a method that includes the operations below. A memory bit cell is formed. A retention circuit is formed with a distance from the memory bit cell. An interconnection line is formed to couple the retention circuit to the memory bit cell. The distance is between a side of the retention circuit and a side of the memory bit cell, and the distance is less than a length of the memory bit cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a memory bit cell, comprising:
a first metal line disposed in a first metal layer and configured to receive a retention voltage; and
a second metal line disposed in the first metal layer and configured to receive a first reference voltage lower than the retention voltage; and
a retention circuit, comprising:
a third metal line disposed in the first metal layer and configured to transmit the retention voltage to the first metal line,
wherein a distance between the second metal line and the third metal line is less than a length of the memory bit cell;
wherein the memory bit cell further comprises:
a fourth metal line disposed in the first metal layer and configured to receive the first reference voltage,
wherein the length of the memory bit cell is approximately equal to a distance between the second metal line and the fourth metal line.

2. The device of claim 1, wherein a distance between the first metal line and the third metal line is approximately equal to or less than the length of the memory bit cell.

3. The device of claim 1, wherein the distance between the second metal line and the third metal line is less than the distance between the first metal line and the third metal line.

4. The device of claim 1, wherein a length of the retention circuit is greater than the length of the memory bit cell.

5. The device of claim 1, further comprising:
a fifth metal line disposed in the first metal layer and corresponding to a first bit line; and
a sixth metal line disposed in the first metal layer and corresponding to a second bit line,
wherein the distance between the second metal line and the third metal line is less than a distance between the fifth metal line and the sixth metal line.

6. The device of claim 1, wherein the retention circuit further comprises:
a seventh metal line disposed in the first metal layer and configured to receive a control signal; and
an eighth metal line disposed in the first metal layer and configured to receive a second reference voltage higher than the retention voltage,
wherein the retention voltage is generated based on the control signal and the second reference voltage.

7. The device of claim 6, wherein the length of the retention circuit is approximately equal to a distance between the seventh metal line and the third metal line.

8. The device of claim 1, further comprising:
an interconnection line disposed in a second metal layer, in order to couple the third metal line to the first metal line.

9. The device of claim 8, wherein the first metal line, the second metal line and the third metal line extend along a first direction, the interconnection line extends along a second direction, the first direction is different from the second direction, and the second direction is perpendicular to the first direction.

10. The device of claim 9, further comprising:
a word line disposed in the second metal layer and coupled to the memory bit cell, wherein the word line extends along the second direction.

11. A device, comprising:
a memory bit cell, comprising:
a first metal line extending along a first direction and configured to receive a retention voltage; and
a second metal line extending along the first direction and configured to receive a first reference voltage lower than the retention voltage; and
a retention circuit, comprising:
a third metal line disposed at a side of the second metal line and configured to transmit the retention voltage to the first metal line,
wherein a distance, along a second direction, between a side of the memory bit cell and a side of the retention circuit is less than a length of the retention circuit;
wherein the memory bit cell further comprises:
a fourth metal line extending along the first direction and configured to receive the first reference voltage,
wherein the length of the memory bit cell is approximately equal to a distance between the second metal line and the fourth metal line.

12. The device of claim 11, wherein the memory bit cell further comprises a first gate electrode and a second gate electrode, the retention circuit comprises a third gate electrode and a fourth gate electrode, the first gate electrode and the third gate electrode are aligned in the second direction, and the second gate electrode and the fourth gate electrode are aligned in the second direction.

13. The device of claim 11, further comprising:
a fifth metal line extending along the first direction and corresponding to a first bit line; and
a sixth metal line extending along the first direction and corresponding to a second bit line,
wherein a distance between the second metal line and the third metal line is less than a distance between the fifth metal line and the sixth metal line.

14. The device of claim 11, wherein the retention circuit further comprises:
a seventh metal line extending along the first direction and configured to receive a control signal; and
an eighth metal line extending along the first direction and configured to receive a second reference voltage higher than the retention voltage,
wherein the retention voltage is generated based on the control signal and the second reference voltage.

15. The device of claim 11, wherein a distance, along the second direction, between the second metal line and the third metal line is less than a length of the memory bit cell.

16. A method, comprising:
forming a memory bit cell;
forming a retention circuit with a distance from the memory bit cell; and
forming an interconnection line to couple the retention circuit to the memory bit cell,
wherein the distance is between a side of the retention circuit and a side of the memory bit cell, and the distance is less than a length of the memory bit cell;
wherein forming the retention circuit comprises:
forming a first metal line in a metal layer, in order to transmit a retention voltage to the memory bit cell,
wherein the memory bit cell operates based on a first reference voltage and a second reference voltage, the retention voltage is higher than the first reference voltage and is lower than the second reference voltage, and a distance between the first metal line and the side of the memory bit cell is less than the length of the memory bit cell.

17. The method of claim 16, further comprising:
forming a pair of metal lines corresponding to a pair of bit lines,
wherein the distance between the side of the retention circuit and the side of the memory bit cell is less than a distance between the pair of metal lines.

18. The device of claim 1, wherein the retention circuit further comprises:
a seventh metal line disposed in the first metal layer;
wherein the length of the retention circuit is approximately equal to a distance between the seventh metal line and the third metal line.

19. The device of claim 1, further comprising:
a word line disposed in a second metal layer and coupled to the memory bit cell.

20. The device of claim 11, further comprising:
an interconnection line coupling the third metal line to the first metal line.

* * * * *